(12) United States Patent
Nakahigashi et al.

(10) Patent No.: US 6,465,057 B1
(45) Date of Patent: *Oct. 15, 2002

(54) PLASMA CVD METHOD AND APPARATUS

(75) Inventors: Takahiro Nakahigashi, Kyoto; Akira Doi, Osaka; Yoshihiro Izumi; Hajime Kuwahara, both of Kyoto, all of (JP)

(73) Assignee: Nissin Electric Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/836,051

(22) PCT Filed: Sep. 11, 1996

(86) PCT No.: PCT/JP96/02581

§ 371 (c)(1),
(2), (4) Date: Jul. 10, 1997

(87) PCT Pub. No.: WO97/10688

PCT Pub. Date: Mar. 20, 1997

(30) Foreign Application Priority Data

Sep. 13, 1995 (JP) ............................................. 7-235155
Aug. 15, 1996 (JP) ............................................. 8-215581

(51) Int. Cl.$^7$ ................................................ H05H 1/24
(52) U.S. Cl. .................... 427/569; 427/577; 427/535
(58) Field of Search ................................ 427/569, 576, 427/577, 578, 535; 118/723 E

(56) References Cited

U.S. PATENT DOCUMENTS

| | | | |
|---|---|---|---|
| 4,664,976 A | * 5/1987 | Kimura et al. | 428/336 |
| 4,675,206 A | 6/1987 | Ikegaya et al. | |
| 4,996,079 A | 2/1991 | Itoh | |
| 5,039,548 A | 8/1991 | Hirose | |
| 5,160,397 A | 11/1992 | Doki et al. | |
| 5,316,804 A | * 5/1994 | Tomikawa et al. | 427/569 |
| 5,368,937 A | 11/1994 | Itoh | |
| 5,521,351 A | 5/1996 | Mahoney | |
| 5,562,952 A | 10/1996 | Nakahigashi | |
| 6,136,386 A | * 10/2000 | Nakahigashi et al. | 427/249.7 |

FOREIGN PATENT DOCUMENTS

| | | |
|---|---|---|
| EP | 330 524 A1 | 8/1989 |
| EP | 447850 | 9/1991 |
| JP | 61106494 A | 5/1986 |
| JP | 61-106494 A | 5/1986 |
| JP | 63217303 A | 9/1988 |
| JP | 01-031974 A | 2/1989 |
| JP | 89101005.X | 9/1989 |
| JP | 1-294867 | 11/1989 |
| JP | 2-80571 | 3/1990 |
| JP | 2-166283 | 6/1990 |
| JP | 02-166283 | 6/1990 |
| JP | 3-189613 | 8/1991 |
| JP | 3-240959 | 10/1991 |
| JP | 04-041672 A | 2/1992 |
| JP | 04-157156 A | 5/1992 |
| JP | 05-051753 A | 3/1993 |
| JP | 5-117087 | 5/1993 |
| JP | 5-237709 | 9/1993 |
| JP | 6-291048 | 10/1994 |
| JP | 06-314660 A | 11/1994 |
| JP | 07207449 A | 8/1995 |

OTHER PUBLICATIONS

Abstract of Japanese Patent Publ. No. 1294867; dated Nov. 28, 1989.
Abstract of Japanese Patent Publ. No. 2166283; dated Jun. 26, 1990.
Abstract of Japanese Patent Publ. No. 3240959; dated Oct. 28, 1991.
Abstract of Japanese Patent Publ. No. 6291048; dated Oct. 18, 1994.
Abstract of Japanese Patent Publ. No. 2080571; dated Mar. 20, 1990.
Abstract of Japanese Patent Publ. No. 3189613; dated Aug. 19, 1991.

* cited by examiner

Primary Examiner—Bret Chen
(74) Attorney, Agent, or Firm—Arent Fox Kintner Plotkin & Kahn

(57) ABSTRACT

The present invention provides a plasma CVD method for forming a plasma from a deposition material gas by application of an electric power, and thereby forming a film on a deposition target object in the plasma, wherein the formation of the plasma from the material gas is performed by applying an RF power and a DC power, and the DC power is applied to an electrode carrying the deposition target object. The present invention also provides a plasma CVD apparatus for forming a plasma from a deposition material gas by applying an electric power from the power applying means, and thereby forming a film on a deposition target object by exposing the deposition target object to the plasma, wherein the power applying means includes RF power applying means and DC power applying means, and the DC power applying means applies an electric power to the electrode carrying the deposition target object.

12 Claims, 11 Drawing Sheets

Fig.9(PriorArt)

Fig.10(PriorArt)

PLASMA CVD METHOD AND APPARATUS

TECHNICAL FIELD

The present invention relates to plasma CVD method and apparatus for forming a film on a substrate to be deposited, i.e., a deposition target object by forming a plasma from a deposition material gas and by exposing the object to the plasma.

BACKGROUND ART

A plasma CVD method has been widely used for manufacturing various kinds of semiconductor devices such as ICs and sensors utilizing semiconductors, manufacturing various kinds of thin-film devices used in solar cells and LCDs (liquid crystal displays), forming films having a high wear resistance on mechanical parts and tools requiring a high wear resistance, and others. Various apparatuses for implementing the plasma CVD method have been known, and a plasma CVD apparatus of a capacity coupling type shown in FIG. 8 is an example of such an apparatus.

The apparatus shown in FIG. 8 is known as a parallel-plated plasma CVD apparatus, and has a vacuum container 1 used as a deposition chamber, in which an electrode 2 also serving as an object holder for carrying a substrate S, i.e., a deposition target object S as well as an electrode 3 opposed to the electrode 2 are arranged.

The electrode 2 is usually used as a ground electrode, and is additionally provided with a heater 21 for heating the object S mounted thereon to a deposition temperature. When the object S is heated by a radiation heat, the heater 21 is separated from the electrode 2.

The electrode 3 is an electric power applying electrode for applying an electric power to a deposition material gas, which is introduced between the electrodes 2 and 3, for forming a plasma. In the illustrated example, the electrode 3 is connected to an RF (radio-frequency) power source 32 via a matching box 31.

The vacuum container 1 is connected via piping to an exhaust device 5, and is also connected via a piping to a gas supply unit 4 of the deposition material gas. The gas supply unit 4 includes one or more gas sources 431, 432, . . . for supplying deposition material gases connected to mass flow controllers 411, 412, . . . and valves 421, 422, . . . .

According to this parallel-plated plasma CVD apparatus, the deposition target object S is transported into the vacuum container 1 by an unillustrated object transporting device, and is mounted on the electrode 2. The exhaust device 5 operates to achieve a predetermined degree of vacuum in the container 1, and the gas supply unit 4 supplies the deposition material gas into the container 1. The RF electrode 3 is supplied with an RF power from the power source 32, and thereby the plasma is produced from the introduced gas. A film is deposited on the surface of the object S in the plasma thus produced.

A plasma CVD apparatus of an induction coupling type shown in FIG. 9 has also been used. This apparatus differs from the apparatus in FIG. 8 in that the object holder 2 is electrically floated, the electrode 3 in FIG. 8 is replaced with an induction coil electrode 7 wound around the container 1, and the matching box 31 and the RF power source 32 are connected to the opposite ends of the induction coil 7. Structures other than the above are the same as those of the apparatus in FIG. 8, and the same or similar parts and portions bear the same reference numbers.

A plasma CVD apparatus shown in FIG. 10 has also been used for forming high adherence films for engineering purposes and other films. The apparatus in FIG. 10 differs from the apparatus in FIG. 8 in that the electrode 2 also serving as the object holder is used as the power applying electrode for applying the electric power, and the electrode 3 opposed to the electrode 2 is used as the ground electrode. In the illustrated example, the electrode 2 is connected to the RF power source 32 via the matching box 31. Structures other than the above are the same as those of the apparatus in FIG. 8, and the same or similar parts and portions bear the same reference numbers.

In this apparatus, ionized particles in the plasma apply an impact against the object S carried by the power applying electrode 2. Therefore, this apparatus can be suitably used for manufacturing tools, machine parts and others. In the apparatus shown in FIG. 8, ionized particles apply a less impact against the object S, so that the deposition target object S can be selected from a wider range.

In the apparatus in FIG. 10, a self-bias voltage appears on the RF electrode 2, and affects the quality of the deposited film. Generally, the deposition under the conditions of such a large self-bias voltage can achieve effects such as improvement of a deposition rate and improvement of a film hardness, although the latter depends on a kind of the film.

A plasma CVD apparatus shown in FIG. 11 is also available. This apparatus differs from the apparatus in FIG. 8 in that an RF power generating device 33 is employed instead of the RF power source 32, and is connected to the electrode 3 via the matching box 31. The RF power generating device 33 includes an RF power amplifier 34 and an RF arbitrary waveform generating device 35 connected thereto. Structures other than the above are the same as those of the apparatus in FIG. 8, and the same or similar parts and portions bear the same reference numbers.

According to this apparatus, formation of the plasma from the deposition material gas is performed by applying an RF power, on which pulse modulation or another modulation is effected, from the RF power generating device 33 to the electrode 3.

Although not shown, such plasma CVD apparatuses are also known that differ from the parallel-plated plasma CVD apparatuses in FIGS. 8 and 10, respectively, in that the matching box 31 and the RF power source 32 in FIGS. 8 and 10 are replaced with a DC power source capable of turning on/off a current. According to these apparatuses, formation of the plasma from the deposition material gas is performed by applying the DC power in a pulse form.

Although not shown, such a method has already been known that forms a plasma from the deposition material gas by applying a modulated RF power by using the induction coupling type-plasma CVD apparatus in FIG. 9 provided with RF power generating device 33 shown in FIG. 11 instead of the RF power source 32.

Various kinds of films can be formed by the plasma CVD apparatuses in the prior art already described. For example, the pressure in the vacuum container 1 is set to about several hundreds of millitorrs, and the deposition material gas supply unit 4 supplies a carbon compound gas such as a methane ($CH_4$) gas or an ethane ($C_2H_6$) gas, or a mixture of such a carbon compound gas and a hydrogen ($H_2$) gas, whereby a carbon (C) film is formed on the deposition target object S.

In this case, the film quality can be controlled by changing the processing temperature of the deposition target object S. For depositing a film on an object made of, e.g., a synthetic resin such as polyimide, the deposition temperature is set to about 100° C. or less in view of the heat resistance of the object, in which case a diamond-like carbon (DLC) film is deposited. Since this DLC film has a large hardness, it is utilized as diaphragms of loud speakers and coatings of ornaments.

With increase in deposition target object temperature, the carbon film has a larger hardness. Therefore, in the case where carbon films are used as coatings for improving, e.g., a surface hardness of cutting tools, various kinds of machine parts or the like, the deposition temperature is generally set to 500° C. or more. If the deposition temperature is set to 900° C. or more, a diamond film is deposited.

As already described, however, the plasma CVD methods and apparatuses, which produce the plasma from the material gas by applying thereto the steady or modulated RF power or by applying the steady or pulse-form DC. power, cannot perform the film deposition at a sufficiently low temperature, and the deposited film cannot have a sufficiently large adherence to the object.

Particularly, in the case where a hard carbon film such as a DLC. film is formed by the plasma CVD method and apparatus, an internal stress is liable to occur in such a hard film due to expansion and contraction of the film itself or the like, and therefore an adjustment with respect to the surface to be deposited may be deteriorated, which tends to cause partial separation or peeling. In order to improve the film adherence, the deposition may be performed under the condition that the self-bias is large. However, this further increases the hardness of the deposited film, which reduces the film adherence.

Accordingly, a first object of the present invention is to provide plasma CVD method and apparatus for depositing a film on a deposition target substrate, i.e., deposition target object in a plasma produced by applying an electric power to a deposition material gas, and particularly plasma CVD method and apparatus which can form a film having a good adherence to the object.

A second object of the present invention is to provide plasma CVD method and apparatus for depositing a film on a deposition target substrate, i.e., deposition target object in a plasma produced by applying an electric power to a deposition material gas, and particularly plasma CVD method and apparatus which can perform film deposition at a lower temperature than the method and apparatus in the prior art.

A third object of the present invention is to provide plasma CVD method and apparatus for depositing a film on a deposition target substrate, i.e., deposition target object in a plasma produced by applying an electric power to a deposition material gas, and particularly plasma CVD method and apparatus which can form a carbon film having a high hardness and a good adherence to the object.

DISCLOSURE OF THE INVENTION

For achieving the first object, the present invention provides a plasma CVD method for forming a plasma from a deposition material gas by applying an electric power, and forming a film on a deposition target object, i.e., deposition target substrate in the plasma, wherein the formation of the plasma from said material gas is performed by applying an RF power and a DC. power, and the DC. power is applied to an electrode carrying the deposition target object.

For achieving the first object, the invention provides a plasma CVD apparatus for forming a plasma from a deposition material gas supplied from a deposition material gas supply unit by applying an electric power from power applying means, and exposing a deposition target substrate, i.e., a deposition target object to the plasma for forming a film on the object, wherein said power applying means includes RF power applying means and DC. power applying means, and said DC power applying means applies the power to an electrode carrying the deposition target object.

According to the plasma CVD method and apparatus of the invention, the plasma is formed from the deposition material gas while applying the DC. power to the electrode carrying the deposition target object, so that ionized particles in the plasma are accelerated toward the deposition target object, and the accelerated particles produces a cleaning effect to remove contaminants or the like sticking to the surface of the object while the deposition is being performed. In addition to this cleaning effect, ionized particles contributing to the deposition are implanted into a surface portion of the object to form a inclination composition layer, so that a film having a good adherence to the object can be formed.

According to the method and apparatus of the invention, since the ionized particles applies an impact on the deposition target object, the method and apparatus of the invention which can be used for manufacturing devices such as ICs can be used more suitably in manufacturing of tools and machine parts.

The other electrode opposed to the electrode carrying the deposition target object may be disposed in a container for deposition, and therefore may be an electrode corresponding to the electrode 3 opposed to the electrode 2 serving as the object holder in the parallel-plated plasma CVD apparatus shown in FIGS. 8, 10 and 11. Alternatively, the other electrode may be an induction coil electrode wound around the container, and therefore may be an electrode corresponding to the coil electrode 7 in the induction coupling type plasma CVD apparatus shown in FIG. 9.

In the method and apparatus of the invention, said RF power may be a modulated RF power. The modulation may be pulse modulation performed by on/off of power application or pulse-like modulation , and may be broadly an amplitude modulation.

A plasma of a high density can be produced owing to this modulation, which is effected on the RF power for plasma production from the deposition material gas, so that a reactivity is improved, and therefore deposition at a low temperature is allowed. Owing to the above modulation, the temperature of electrons and ions in the plasma is controlled to increase relatively the amount of produced radicals in the plasma which contribute to the deposition. This promotes reaction at the surface of the deposition target object, and therefore improves the film adherence and deposition rate. According to the method and apparatus of the invention, the foregoing second object can be achieved by employing the modulated RF power as the foregoing RF power.

According to the method and apparatus of the invention, a basic RF power before modulation may have, for example, a sinusoidal, square, saw-tooth-like or triangular waveform.

The basic RF power before modulation may have a predetermined frequency (e.g., 13.56 MHz) between about 10 MHz and about 100 MHZ, and a pulse modulation is effected on the basic RF power with a modulation frequency between about $1/10^5$ and about 1/10 of the predetermined frequency, and more preferably between about $1/10^4$ and about $1/10^3$. In other words, the pulse-modulated RF power may be produced by affecting the pulse modulation on the basic RF power having the frequency in the above range with the modulation frequency between about 100 Hz and about 10 MHZ, and more preferably between about 1 kHz and about 100 kHz.

For deposition of a carbon (C) film which will be described later, the pulse modulation may be effected on the basic RF power of a frequency of, e.g., 13.56 MHz with the modulation frequency from about 100 Hz to about 500 kHz. In particular, for forming highly crosslinked carbon film, the modulation frequency from about 100 Hz to about 5 kHz is desirably employed. For depositing a high-density carbon film, the modulation frequency from about 10 kHz to about 100 kHz is desirably employed.

The reason for employing the basic RF power of the frequency in the above range is as follows. If it were lower than 10 MHz, the plasma density would be insufficient. Even if it were higher than 100 MHZ, the plasma density would not be improved further, and an electric power cost would uselessly increase. The reason for employing the pulse modulation frequency in the above range is as follows. If it were lower than 100 Hz, the modulation would not provide an effect of improving the plasma density. Even if it were higher than 10 MHz, the plasma density would not be improved further, and an electric power cost would uselessly increase.

The duty ratio (on-time/(on-time+off-time)) of the pulse modulation may be from about 10% to about 90%. Although not restricted, it may be typically about 50%. If it were lower than 10%, the reaction time would be short and therefore the deposition rate would lower. If it were higher than 90%, a time for power application would be excessively long, and therefore an effect of improving the plasma density by the modulated RF power would be reduced.

In the method and apparatus of the invention, the DC potential applied to the electrode carrying the deposition target object is usually negative potential. The negative potential during deposition have a magnitude, which does not cause or substantially cause etching of the deposition target object and/or the film formed thereon by ionized particles which are accelerated.

According to the method and apparatus of the invention, the RF power may be applied to the electrode carrying the deposition target object, in which case an RF power and a DC. power are applied together in a superposed manner. Alternatively, the RF power may be applied to the electrode opposed to the electrode carrying deposition target object.

In the case where the RF power is applied to the electrode carrying the deposition target object, ionized particles exert a large impact to the deposition target object. Therefore, the electrode supplied with the RF power may be selected depending on a material, purpose and others of the deposition target object.

According to the method and apparatus of the invention, the DC. power may be in a pulse form, which further improves a density of the plasma produced by electric discharging. Also, the effect of accelerating the ionized particles in the plasma toward the deposition target object may be the same or improved, because the ionized particles are particularly strongly accelerated during turn-on of the DC. power.

The frequency of the pulse modulation may be in a range from about 1 kHz to about 100 kHz, because the frequency lower than 1 kHz would not improve the effect of improving the plasma density, and the frequency higher than 100 kHz would uselessly increase the cost without further improving the effect of improving the plasma density. The duty ratio may be in a range from about 10% to about 90%, and is typically about 50%, although not restricted thereto.

In the method for forming the plasma from the deposition material gas by applying the electric power, and forming the film on the deposition target object under the plasma, an interface layer may be formed on the object, and thereafter an upper layer of the same material as the interface layer may be formed, in which case formation of the interface layer is performed by the foregoing method of the invention, and the interface layer thus formed can have a good adherence to the deposition target object.

The power applied for formation of the upper layer is not restricted, and the interface and upper layers are made of the same material and thus have good adjustment properties, so that a good adherence can be achieved between them. In addition to the interface layer, the upper layer may also be formed by the foregoing method of the invention, in which case the adherence between them can be further improved.

The method and apparatus of the invention described above may be provided with a deposition material gas supply un it which can supply, as the deposition material gas, a gas of carbon compound for forming a carbon film, or can supply a gas of a carbon compound together with a gas of a kind different from the carbon compound gas for forming the carbon film. By using such deposition material gas, the carbon film, and typically a DLC. film may be formed on the deposition target object.

In this case, since the plasma is formed from the deposition material gas while applying the DC. power to the electrode carrying the deposition target object, a carbon film having a large hardness and a good adherence may be formed on the object for the same reason as the above. Thus, this can achieve the third object of the invention.

Carbon compound for the carbon film deposition may be one or more material selected from a group including methane ($CH_4$), ethane ($C_2H_6$), propane ($C_3H_8$), butane ($C_4H_{10}$), acetylene ($C_2H_2$), benzene ($C_6H_6$), carbon tetrachloride ($CF_4$) and carbon hexafluoride ($C_2F_6$) which have been generally used for carbon film deposition. Each of these materials may be solely used, or may be used together with another kind of gas such as a hydrogen ($H_2$) gas or an inert gas for the carbon film deposition.

For forming the carbon film by the method and apparatus of the invention, there may be employed a deposition material gas supply unit which can supply, in addition to the deposition material gas for the carbon film deposition, either or both of a nitrogen ($N_2$) gas or an ammonia ($NH_3$) gas, whereby either or both the nitrogen gas and the ammonia gas may be supplied together with or instead of the deposition material gas for carbon film deposition before completion of the deposition (typically, immediately before completion of the deposition) while continuing application of the power, so that a carbon nitride layer may be formed at the surface portion of the carbon film.

In the case where a different kind of gas such as a hydrogen gas is used as the deposition material gas for carbon film deposition, the gas containing nitrogen (N) may be supplied instead of the deposition material gas, in which case only supply of the carbon compound gas may be stopped, and the different kind of gas may be continuously supplied, which is allowed depending on the kind of the gas.

Since the carbon nitride has an extremely high hardness, the deposited carbon film can have an improved hardness. Since both the nitride layer and the carbon film under the same contains carbon, they have good adjustment properties and therefore a good adherence.

The material of the deposition target substrate, i.e., deposition target object, on which the carbon film is deposited according to the method and apparatus of the invention, is not restricted, but may be an organic material. The organic material may be thermosetting resin, thermoplastic resin, rubber, paper, wood or the like. In the case where a hard carbon film is deposited on the object made of such a material, the conventional plasma CVD method cannot provide a sufficiently good film adherence, and partial peeling may occur. However, a sufficiently good film adherence can be obtained according to the method and apparatus of the invention.

The thermosetting resin may be phenol-formaldehyde resin, urea resin, melamine-formaldehyde resin, epoxy resin, furan resin, xylene resin, unsaturated polyester resin, silicone resin, diallyl phthalate resin or the like.

The thermoplastic resin may be vinyl resin (polyvinyl chloride, polyvinyl dichloride, polyvinyl butyrate, polyvinyl alcohol, polyvinyl acetate, polyvinyl formal or the like), polyvinylidene chloride, chlorinated polyether, polyester resin (polystyrene, styrene acrylonitrile copolymer or the like), ABS, polyethylene, polypropylene, polyacetal, acrylic resin (poly methyl methacrylate, denatured acrylic or the like), polyamide resin (nylon 6, 66, 610, 11 or the like), cellulosic resin (ethyl cellulose, acetyl cellulose, propyl cellulose, cellulose acetate butyrate, cellulose nitrate or the like), polycarbonate, phenoxy resin, fluorocarbon resin (trifluoro chloro ethane, ethylene tetrachloride, ethylene tetrachloride propylene hexafluoride, vinylidene fluoride or the like), or polyurethane or the like.

The rubber may be natural rubber, butyl rubber, ethylene-propylene rubber, chloroprene rubber, chlorinated polyethylene rubber, epichlorohydrin rubber, acrylic rubber, nitrile rubber, urethane rubber, silicone rubber, fluororubber or the like.

The thermosetting resin may be used as a material of films, phonograph records, various kinds of nets, buttons, ornaments, toys, stationery, and sporting goods, and may also be used as a material of household articles such as kitchenwares, various kinds of containers, tableware. It may further be used as a material of electric parts such as insulators or terminals, or machine parts such as fuel tanks, automobile bodies, automobile bumpers or bearings.

The thermoplastic resin may be used as a material of films, phonograph records, various kinds of nets, buttons, ornaments, toys, stationery, sporting goods, and may be used as a material of household articles such as kitchenwares, various kinds of containers or tableware. It may further be used as a construction material, e.g., for water pipings, building members or floor members, or a material of optical parts such as lenses or prisms, automobile parts such as sealings or packings, or machine parts such as shock absorbers, gears or bearings.

The rubber may be a material of wiper blades of automobile windows, or tires, sealings or the like of automobiles, bicycles or the like.

Objects made of such resin or rubber may be generally used at portions causing a friction with respect to other objects coated with lubricant oil for improving a lubricity. However, the amount of lubricant and therefore the lubricity at these portions decrease with time. The method and apparatus of the invention may be used to form the carbon film, and typically the DLC. film having a good lubricity at these friction portions, whereby low friction properties can be maintained for a long time. If the method and apparatus of the invention are employed for objects made of, e.g., resin having a low heat resistance, the heat resistance can be improved.

In addition to the materials described above, ceramics may be the material of the deposition target object for carbon film deposition according to the method and apparatus of the invention.

In the case where the carbon film is formed on the deposition target object made of an organic material by the method and apparatus of the invention, such pretreatment gas supply means may be employed that can supply, as a pretreatment plasma material gas for the deposition target object, at least one kind of gas selected from a group including, e.g., a fluorine (F) -contained gas, a hydrogen gas and an oxygen ($O_2$) gas. In this case, the carbon film is deposited on the object after exposing the object to the plasma of the pretreatment gas.

The above fluorine-contained gas may be a fluorine ($F_2$) gas, a nitrogen trifluoride ($NF_3$) gas, a sulfur hexafluoride ($SF_6$) gas, a carbon tetrachloride ($CF_4$) gas, a silicon tetrachloride ($SiF_4$) gas, a disilicon hexafluoride ($Si_2F_6$) gas, a chlorine trifluoride ($ClF_3$) gas, a hydrogen fluoride (HF) gas or the like.

By exposing the deposition target object to the plasma of the above gas, the surface of the object is cleaned, and the roughness of the object surface is improved. These contribute to improvement of the carbon film adherence.

When employing the plasma of the fluorine-contained gas, fluorine termination is formed at the object surface. When employing the plasma of the hydrogen gas, hydrogen termination is formed at the object surface. Since fluorine-carbon coupling and hydrogen-carbon coupling are stable, the above termination treatment can provide stable coupling of carbon atoms in the film with fluorine atoms or hydrogen atoms in the object surface portion. Owing to this fact, it is possible to improve the adherence between the object and the carbon film to be deposited subsequently. When employing the oxygen gas plasma, contaminants such as organic matters sticking onto the object surface can be particularly efficiently removed, which can improve the adherence between the object and the carbon film to be deposited later.

According to the invention, the pretreatment of the deposition target object by the plasma prior to the carbon film deposition may be performed several times with the same kind of plasma or different kinds of plasma. For example, after exposing the deposition target object to the oxygen gas plasma, it may be exposed to the fluorine-contained gas plasma or hydrogen-contained gas plasma, and then the carbon film may be deposited thereon, in which case, after the object surface is cleaned, the fluorine or hydrogen termination is formed at the object surface, so that the carbon film deposited thereafter has a very good adherence to the object.

PREFERRED EMBODIMENTS FOR IMPLEMENTING THE INVENTION

Embodiments of the invention will be described below with reference to the drawings.

Figure 1:
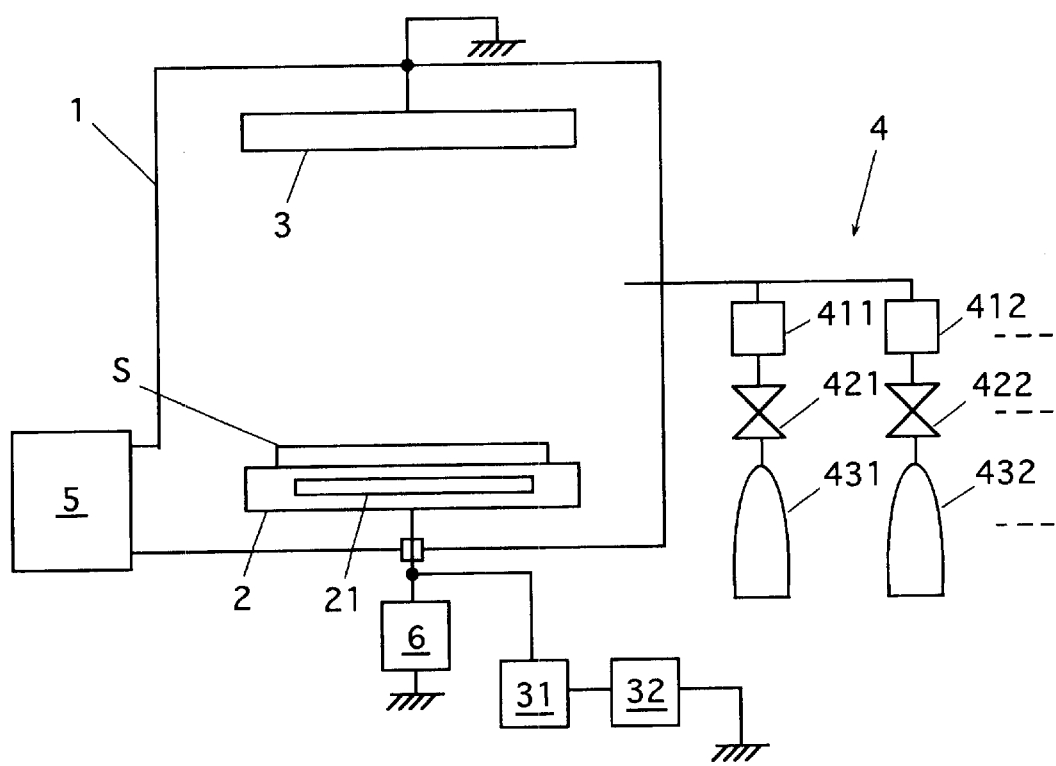
FIG. 1 shows a schematic structure of an example of a plasma CVD apparatus according to the invention.

FIG. 1 shows a schematic structure of an example of a plasma CVD apparatus according to the invention. This apparatus differs from the apparatus in FIG. 10 in that a DC power source 6 is connected to the electrode 2 also serving as an object holder in parallel with a series circuit formed of the matching box 31 and the RF power source 32. Structures other than the above are the same as those in the apparatus in FIG. 10, and the same or similar portions bear the same reference numbers.

For implementing the method of the invention with this apparatus, the deposition target object S is transported into the vacuum container 1 by an unillustrated object transporting device, and is mounted on the electrode 2. The exhaust device 5 operates to achieve a predetermined degree of vacuum in the container 1, and the gas supply unit 4 supplies the deposition material gas into the container 1. The electrode 2 is supplied with an RF power from the RF power source 32 through the matching box 31 and is also supplied with a DC. power (usually negative) from the power source 6. Thereby, the plasma is produced from the introduced deposition material gas, and a predetermined film is deposited on the object S in the plasma thus produced.

According to the plasma CVD method and apparatus described above, the electrode 2 also serving as the object holder is supplied with the DC. power for forming a plasma from the deposition material gas, so that ionized particles in the plasma are accelerated toward the object S during the deposition. Therefore, it is possible to deposit the film having a good adherence to the object S.

Figure 2:
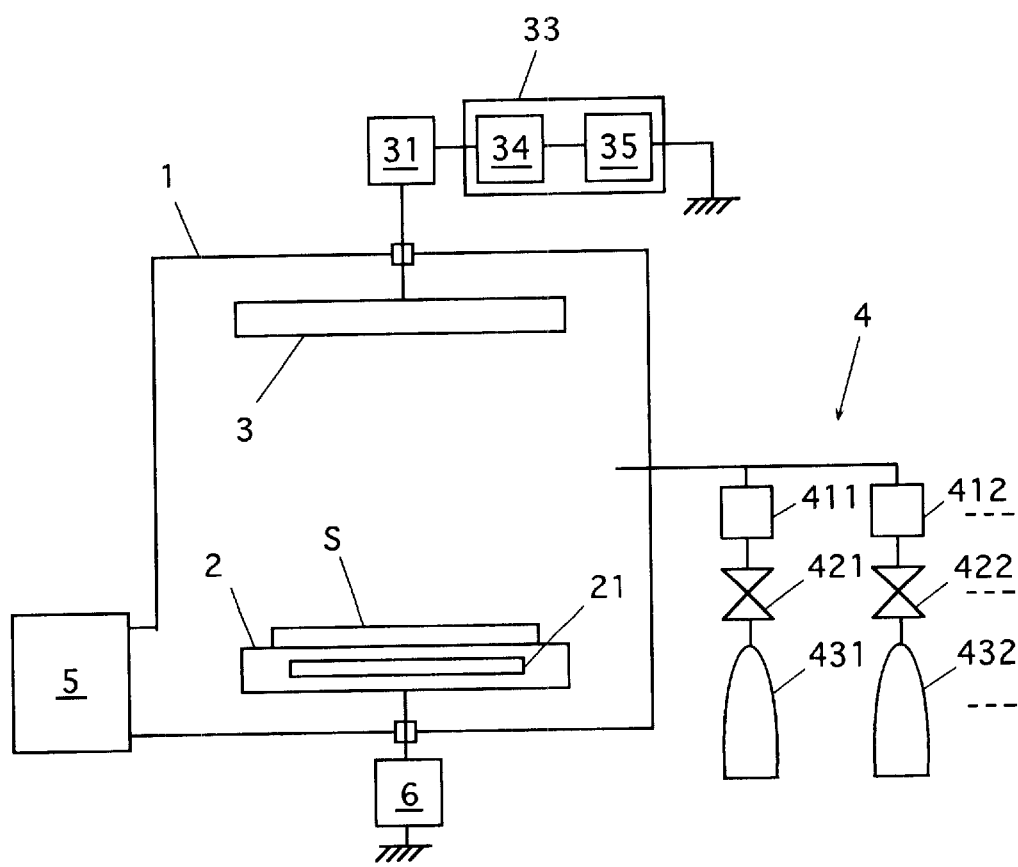
FIG. 2 shows a schematic structure of another example of a plasma CVD apparatus according to the invention.
Figure 11:
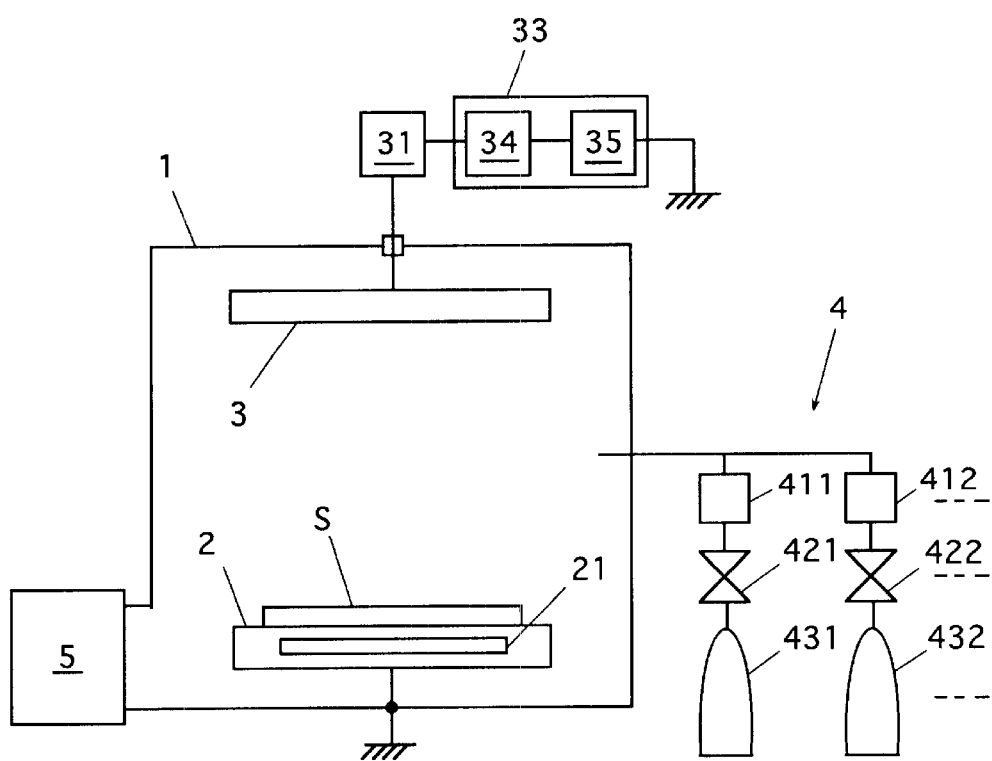
FIG. 11 shows a schematic structure of yet another example of a plasma CVD apparatus in the prior art.

FIG. 2 shows a schematic structure of another example of a plasma CVD apparatus according to the invention. This apparatus differs from the apparatus shown in FIG. 11 in that the electrode 2 also serving as an object holder is not grounded, but is connected to the DC. power source 6. Structures other than the above are the same as those in the apparatus in FIG. 11, and the same or similar portions bear D2 the same reference numbers.

For implementing the method of the invention with this apparatus, the electrode 3 is supplied with a pulse-modulated RF power prepared from the RF power generating device 33 through the matching box 31, and simultaneously the electrode 2 is supplied with a DC. power (usually negative) from the power source 6. In this manner, a plasma is formed from the material gas.

The pulse-modulated RF power applied to the electrode 3 may be prepared in such a manner that the pulse modulation is effected on the basic RF power of a frequency from 10 MHz to 100 MHz (e.g., of 13.56 MHz) with the modulation frequency from 100 Hz to 10 MHz (e.g., from 1 kHz to 100 kHz). The duty ratio (on-time/(on-time+off-time)) is determined in a range from 10% to 90%. Deposition operations and conditions other than the above are the same as those in the deposition by the apparatus in FIG. 11.

According to the plasma CVD method and apparatus described above, the pulse-modulated RF power is applied to the electrode 3 opposed to the electrode 2 also serving as the object holder, and simultaneously the DC. power is applied to the electrode 2 serving as the object holder, so that a plasma is formed from the deposition material gas. As a result, the plasma can have a higher density than that by the conventional method and apparatus, in which a steady or pulse-modulated RF power is applied, or a steady or pulse-form DC. power is applied for forming a plasma from the material gas. Therefore, a heating temperature of the object S which is heated by the heater 21 through the electrode 2 can be low. Also, ionized particles in the plasma are accelerated toward the object S during the deposition, so that the film can have a good adherence to the object S.

Figure 3:
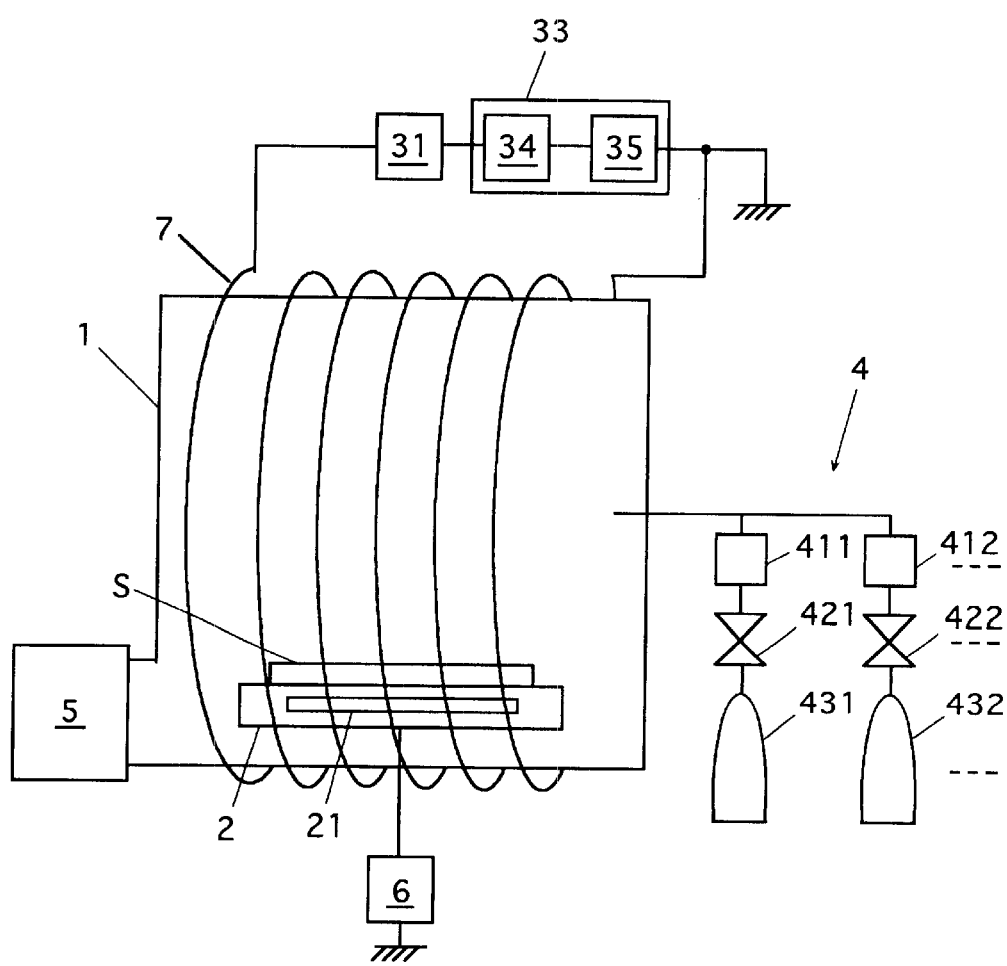
FIG. 3 shows a schematic structure of still another example of a plasma CVD apparatus according to the invention.
Figure 9:
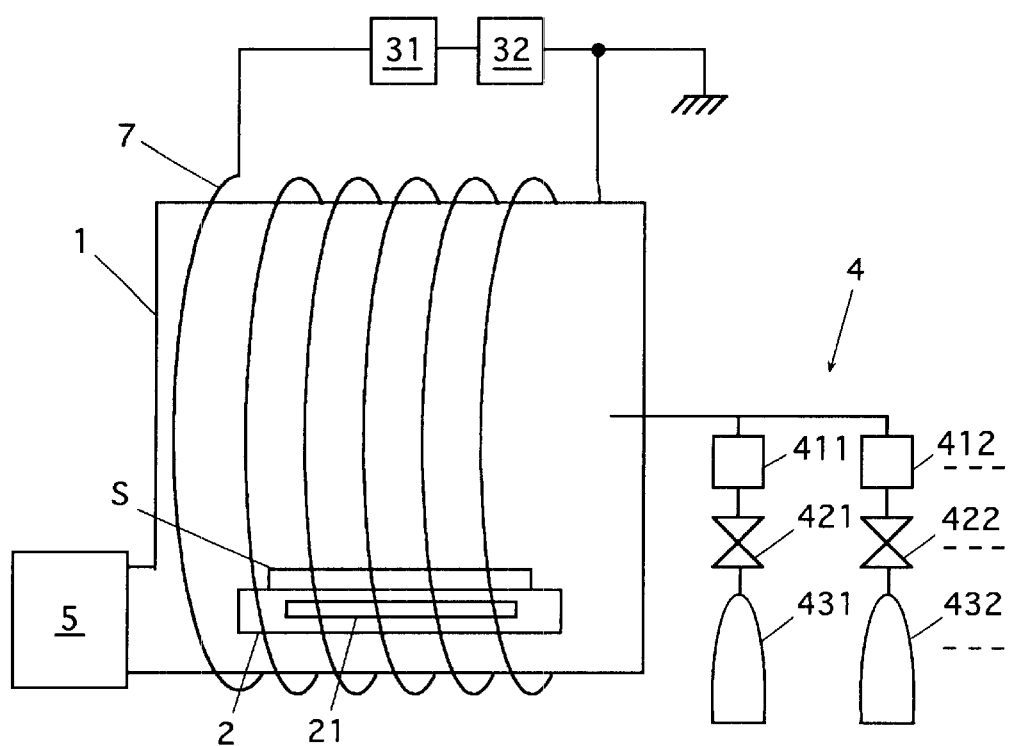
FIG. 9 shows a schematic structure of another example of a plasma CVD apparatus in the prior art.

FIG. 3 shows a schematic structure of still another example of a plasma CVD apparatus according to the invention. This apparatus differs from the apparatus shown in FIG. 9 in that the RF power generating device 33 is employed instead of the RF power source 32, and is connected to the coil electrode 7 through the matching box 31. The RF power generating device 33 includes the RF power amplifier 34 and the RF arbitrary waveform generating device 35 connected thereto. The electrode 2 also serving as the object holder is not grounded, but is connected to the DC. power source 6. Structures other than the above are the same as those in the apparatus in FIG. 9, and the same or similar portions bear the same reference numbers.

For implementing the method of the invention with this apparatus, the pulse-modulated RF power is applied to the induction coil electrode 7, and simultaneously the DC. power (usually negative) is applied to the electrode 2 for forming a plasma from the material gas. Deposition operations other than the above are similar to those by the apparatus in FIG. 9.

Deposition by this apparatus can achieve an effect similar to that by the apparatus in FIG. 2.

Figure 4:
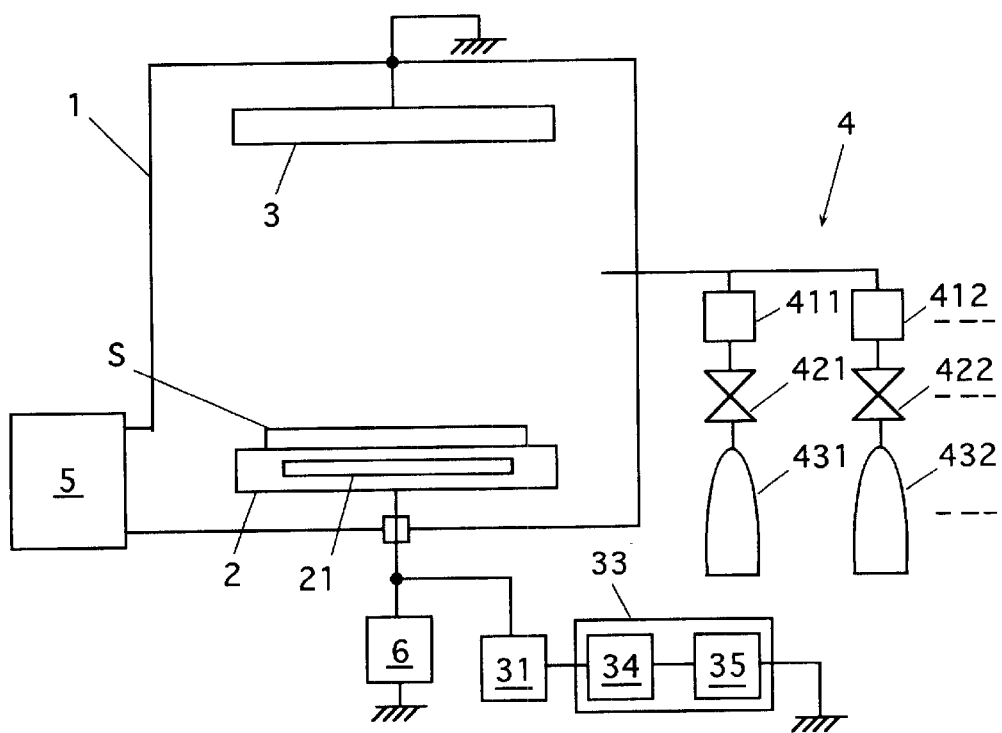
FIG. 4 shows a schematic structure of yet another example of a plasma CVD apparatus according to the invention.

FIG. 4 shows a schematic structure of yet another example of a plasma CVD apparatus according to the invention. This apparatus differs from the conventional apparatus shown in FIG. 10 in that the RF power generating device 33 is employed instead of the RF power source 32, and is connected through the matching box 31 to the electrode 2 also serving as the object holder. In addition to this, the DC. power source 6 is connected in parallel with the matching box 31 and the device 33. Structures other than the above are the same as those in the apparatus in FIG. 10, and the same or similar portions bear the same reference numbers.

For implementing the method of the invention with this apparatus, formation of the plasma from the deposition material gas is performed by applying the DC. power to the electrode 2 also serving as the object holder from the power source 6 and by applying simultaneously the pulse-modulated RF power from the RF power generating device 33, and thus is performed by applying both the powers in a superposed manner. Deposition operations other than the above are similar to those by the apparatus in FIG. 10.

According to the above manner and structure, ionized particles in the plasma are accelerated further strongly toward the object S, so that the deposited film can have a further improved adherence.

Figure 5:
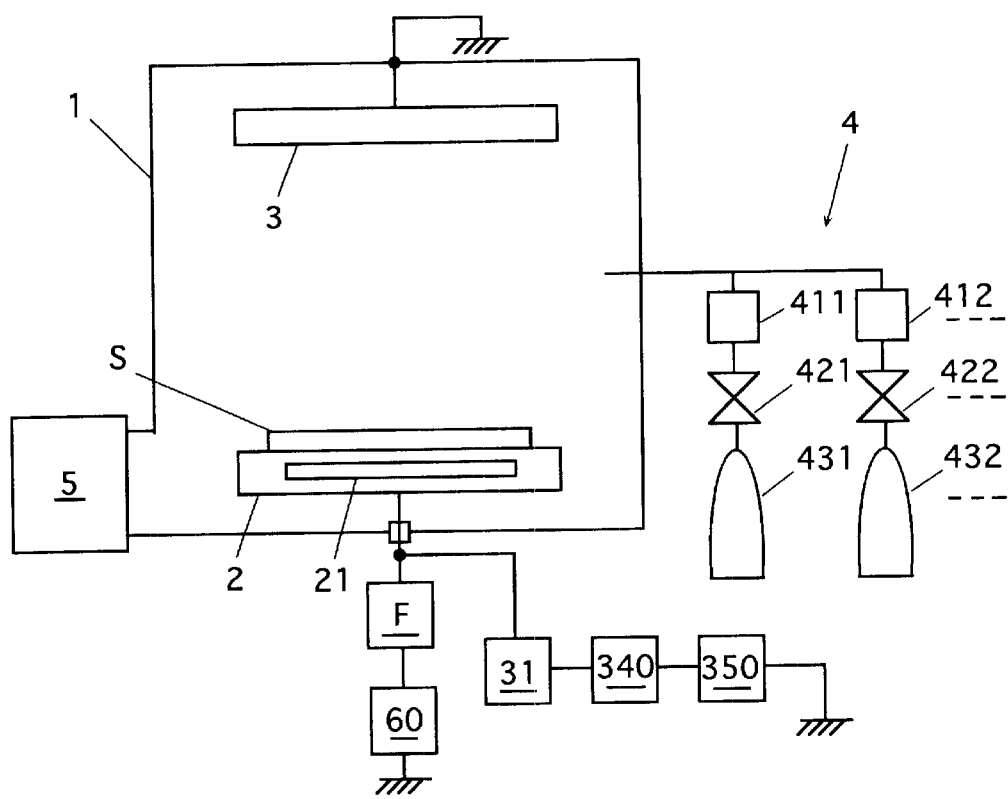
FIG. 5 shows a schematic structure of still another example of a plasma CVD apparatus according to the invention.

FIG. 5 shows a schematic structure of still another example of a plasma CVD apparatus according to the invention. This apparatus differs from the apparatus shown in FIG. 11 in that the electrode 3 is grounded. Further, the matching box 31, an RF power source 340 and an arbitrary waveform forming device 350 are connected in series to the electrode 2 also serving as the object holder, and a circuit formed of a low-pass filter F and a DC. power source 60 is connected in parallel with this series circuit. Filter F prevents flow of an RF current to the DC. power source 60. Structures other than the above are the same as those in the apparatus in FIG. 11, and the same or similar portions bear the same reference numbers.

The DC. power sources 6 used in the apparatuses in FIGS. 1 and 4 also employ low-pass filters similar to the above.

In the apparatus shown in FIG. 5, the pulse-modulated RF power and the DC. power are applied in a superposed manner to the electrode 2, similarly to the foregoing apparatus. The deposition operation and effect of this apparatus are similar to those of the apparatus in FIG. 4.

Figure 6:
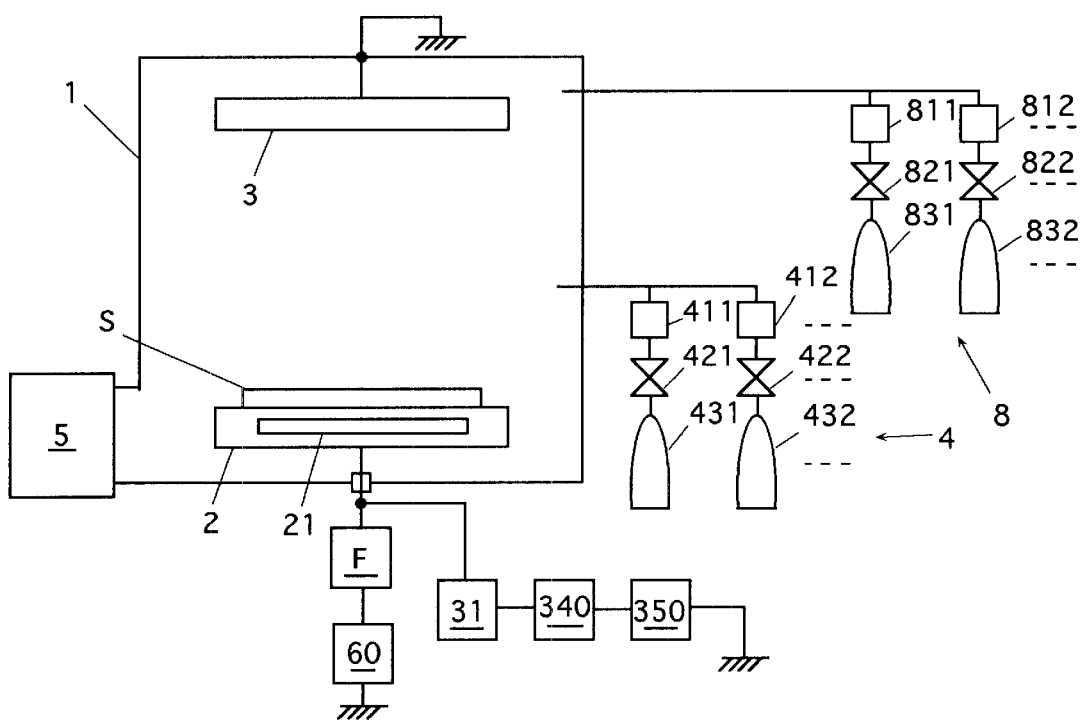
FIG. 6 shows a schematic structure of a further example of a plasma CVD apparatus according to the invention.

FIG. 6 shows a schematic structure of a further example of a plasma CVD apparatus according to the invention. This apparatus differs from the apparatus in FIG. 5 in that a pretreatment gas supply unit 8 is connected to the vacuum container 1 to which the deposition material gas supply unit 4 is also connected. The gas supply unit 8 can supply one or more of a fluorine-contained gas, a hydrogen gas and an oxygen gas, and is formed of one or more gas sources 831, 832, . . . of the pretreatment gases connected through mass-flow controllers 811, 812, . . . and valves 821, 822, . . . , respectively. Structures other than the above are the same as those in the apparatus in FIG. 5, and the same or similar portions bear the same reference numbers.

For implementing the method of the invention with this apparatus, the object S is carried by the electrode 2, and the exhaust device 5 operates to attain a predetermined degree of vacuum in the container 1. Then, as a pretreatment gas, one or more kinds of gases selected from the fluorine-contained gas, hydrogen gas and oxygen gas are introduced from the pretreatment gas supply 8 into the container 1, and the RF power is supplied to the electrode 2, whereby a plasma is formed from the introduced pretreatment gas, and the surface treatment is effected on the object S under the plasma. Formation of the plasma from the pretreatment gas, which is performed by application of the modulated RF power in the above manner, may be performed by application of the steady RF power.

Then, similarly to the deposition by the apparatus shown in FIG. 5, the deposition material gas is introduced from the gas supply unit 4 into the container 1, and the plasma is formed from the deposition material gas by applying the pulse-modulated RF power and the DC. power in a superposed manner to the electrode 2. Thereby, a predetermined film is formed on the object S.

According to the CVD method and apparatus described above, if the object S is made of an organic material, the surface of the object S may be exposed to one or more of the fluorine-contained gas plasma, hydrogen gas plasma and oxygen gas plasma prior to the deposition. Thereby, the surface of the object S is cleaned, and the surface roughness of the object S is improved. Further, if the fluorine-contained gas plasma and/or hydrogen gas plasma are employed, fluorine termination and/or hydrogen termination are effected at the surface of the object S. If the oxygen gas plasma is employed, contaminants such as organic matters sticking onto the surface of the object S can be removed particularly efficiently. Therefore, the deposited film (particularly, carbon film) can have a further improved adherence to the object S.

Figure 7:
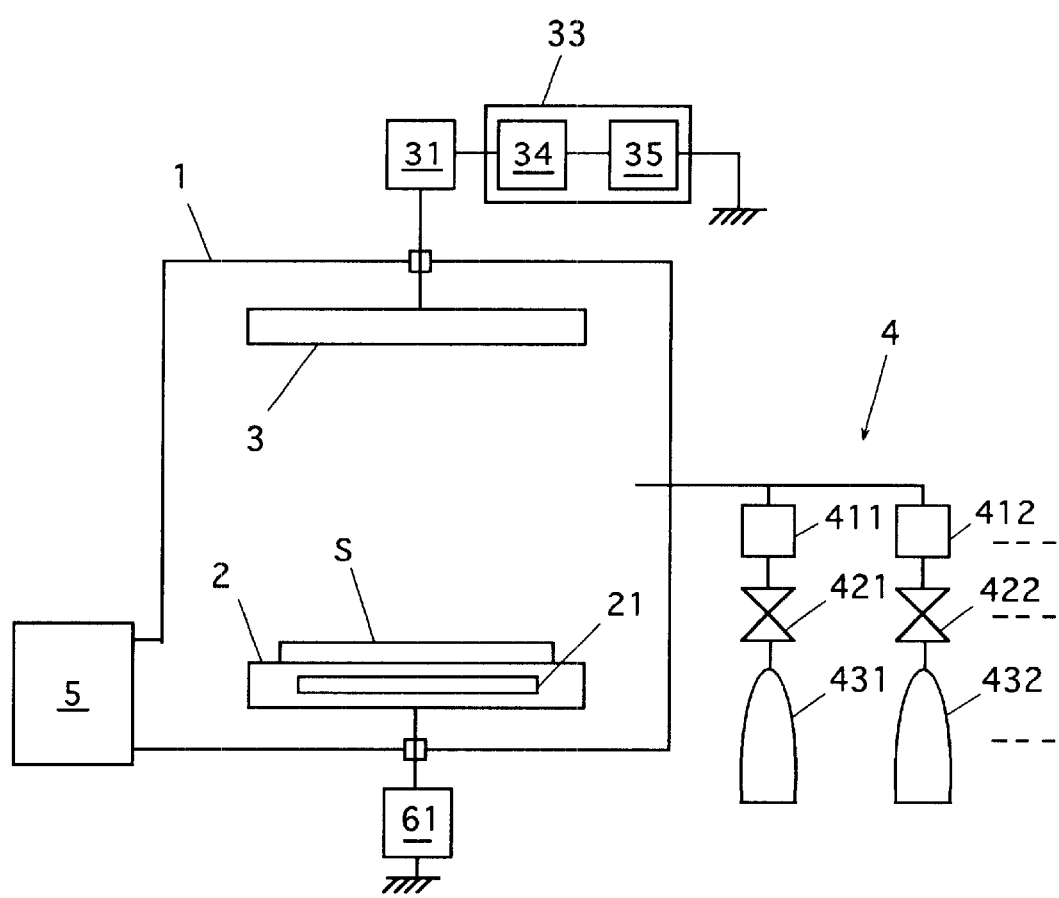
FIG. 7 shows a schematic structure of further another example of a plasma CVD apparatus according to the invention.
Figure 8:
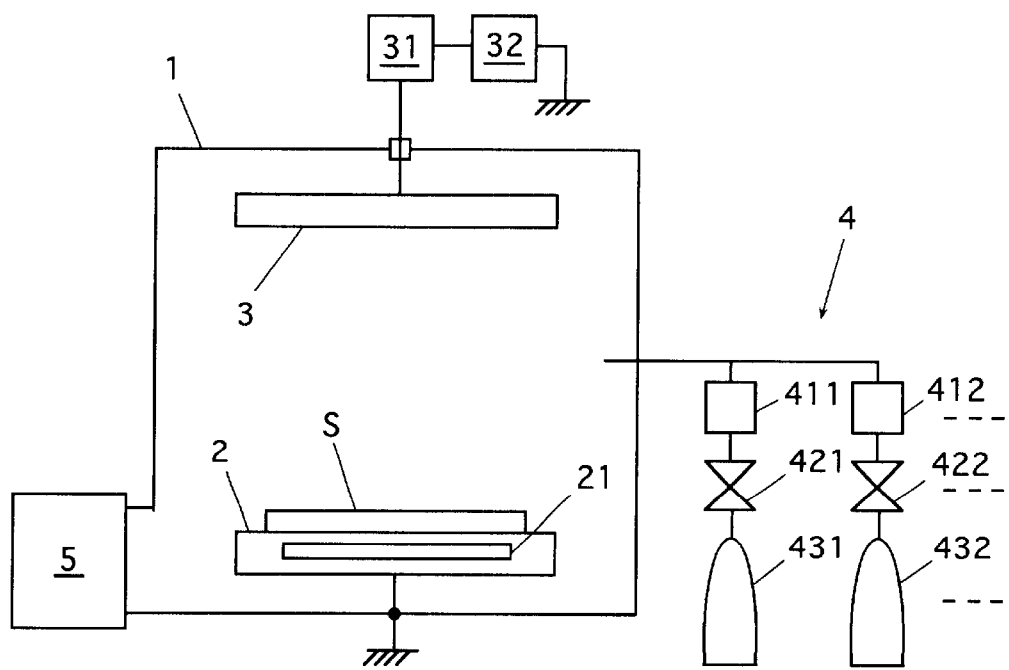
FIG. 8 shows a schematic structure of an example of a plasma CVD apparatus in the prior art.

FIG. 7 shows a schematic structure of further another example of a plasma CVD apparatus according to the invention. This apparatus differs from the apparatus shown in FIG. 2 in that the DC. power source 6 is replaced with a DC. power source device 61 allowing turn-on/off of the power. Structures other than the above are the same as those in the apparatus in FIG. 2, and the same or similar portions bear the same reference numbers.

For implementing the method of the invention with the this apparatus, a plasma is formed from the deposition material gas by applying the pulse-modulated RF power to the electrode 3 opposed to the electrode 2 also serving as the object holder and by simultaneously applying the DC. power in the pulse form to the electrode 2 also serving as the object holder. The pulse frequency of the DC. power in the pulse form is in a range from 1 kHz to 100 kHz, and the duty ratio is in a range from 10 to 90%.

Thereby, the plasma thus obtained can have a higher density than that by the apparatus in FIG. 2, and therefore the heating temperature of the object S by the heater 21 can be further reduced. Also, ionized particles in the plasma can be accelerated further strongly toward the object S, and thus the deposited film can have a further improved adherence to the object S.

Although not shown, the apparatuses in FIG. 1 and FIGS. 3 to 6 may employ a DC. power source device allowing turn-on/off of the power instead of the DC. power sources 6 and 60. This can further lower the heating temperature of the object S by the heater 21, compared with the apparatuses in FIG. 1 and FIGS. 3 to 6, and the deposited films can have a further improved adherence to the object S.

Although not shown, the apparatuses in FIGS. 1 to 4 and FIG. 7 may employ the pretreatment gas supply unit 7. This allows deposition of the film having a further improved adherence to the object S compared with the apparatuses in FIGS. 1 to 4 and FIG. 7, when a carbon film or the like is to be deposited on the object S made of an organic material.

Specific examples for implementing the method of the invention will be described below.

The following table 1 shows deposition conditions of the specific embodiments (embodiments 1-1 to 1-12) of the method of the invention as well as the deposition examples (comparative examples 1-1 to 1-9) of the conventional plasma CVD method.

In the following table 1, the embodiments 1-1 to 1-6 relate to deposition of titanium-contained films, and comparative examples 1-1 to 1-4 are shown for comparison with these embodiments. Comparative examples 1-5 to 1-9 are shown for comparison with the embodiments 1-7 to 1-12.

TABLE 1

| #A | #B | #C | #D | #E | #F | #G |
|---|---|---|---|---|---|---|
| E1-1 | 2 | S/DC | M | | TiC | $TiCl_4$, $CH_4$, $H_2$ |
| E1-2 | 4 | S/DC + M | G | | TiN | $TiCl_4$, $N_2$, $NH_3$, $H_2$ |
| E1-3 | 7 | P/DC | M | | TiCN | $TiCl_4$, $CH_4$, $N_2$, $H_2$ |
| E1-4 | *1 | P/DC + M | G | | TiC | $TiCl_4$, $CH_4$, $H_2$ |
| E1-5 | 3 | S/DC | — | M | TiAlN | $TiCl_4$, Al + HCl—$AlCl_3$, $N_2$, $NH_3$, $H_2$ |
| E1-6 | *2 | P/DC | — | M | TiCN | $TiCl_4$, $CH_4$, $N_2$, $NH_3$, $H_2$ |
| E1-7 | 2 | S/DC | M | | $Al_2O_3$ | Al + HCl—$AlCl_3$, $CO_2$, $H_2$ |
| E1-8 | 4 | S/DC + M | G | | $SiO_2$ | $SiCl_4$, $O_2$ |
| E1-9 | 7 | P/DC | M | | SiN | $SiCl_4$, $N_2$, $NH_3$ |
| E1-10 | *1 | P/DC + M | G | | SiC | $SiCl_4$, $CH_4$, $H_2$ |
| E1-11 | 3 | S/DC | — | M | DLC | $CH_4$, $H_2$ |
| E1-12 | *2 | P/DC | — | M | $Al_2O_3$ | Al + HCl—$AlCl_3$, $CO_2$, $H_2$ |
| Cl-1 | | S/DC | G | | TiN | $TiCl_4$, $N_2$, $NH_3$, $H_2$ |

TABLE 1-continued

| #A | #B | #C | #D | #E | #F | #G |
|---|---|---|---|---|---|---|
| C1-2 | P/DC | G | | | TiCN | $TiCl_4$, $CH_4$, $N_2$, $NH_3$, $H_2$ |
| C1-3 | S/RF | G | | | TiAlN | $TiCl_4$, Al + HCl—$AlCl_3$, $N_2$, $NH_3$, $H_2$ |
| C1-4 | G | | | M | TiC | $TiCl_4$, $CH_4$, $H_2$ |
| C1-5 | S/DC | G | | | $Al_2O_3$ | Al + HCl—$AlCl_3$, $CO_2$, $H_2$ |
| C1-6 | P/DC | G | | | $SiO_2$ | $SiCl_4$, $O_2$ |
| C1-7 | S/RF | G | | | SiN | $SiCl_4$, $N_2$, $NH_3$ |
| C1-8 | G | | | M | SiC | $SiCl_4$, $CH_4$, $H_2$ |
| C1-9 | G | | | M | DLC | $CH_4$, $H_2$ |

A: Embodiments or Comparative Examples
E: Embodiment
C: Comparative Example
B: Figures showing the used appratus (e.g., "3" represents FIG. 3)
C: Powers applied to electrode 2
S/DC: steady DC power
P/DC: pulse form DC power
S/RF: steady RF power
M: modified RF power
G: ground
D: Powers applied to electrode 3
E: Powers applied to induction coil electrode 7
F: Kinds of films
G: Deposition material gases
*1: Apparatus employing power source 61 instead of power source 6 in FIG. 4
*2: Apparatus employing power source 61 instead of power source 6 in FIG. 3

The following table 2 shows the deposition temperature, film hardness and film adherence of the specific embodiments (embodiments 1-1 to 1-12) of the method of the invention shown in the foregoing table 1 as well as the DD deposition examples (comparative examples 1-1 to 1-9) of the conventional plasma CVD method. The film hardness was determined in Vickers hardness (Hv), and the film adherence was evaluated based on critical loads measured in a scratching method with a diamond penetrator.

TABLE 2

| | Deposition Temp. (° C.) | Film Hardness Hv (kg/mm$^2$) | Film Adherence (N) |
|---|---|---|---|
| E1-1 | 480 | 3000 | 40 |
| E1-2 | 490 | 2000 | 45 |
| E1-3 | 490 | 2700 | 43 |
| E1-4 | 495 | 3200 | 40 |
| E1-5 | 487 | 2600 | 45 |
| E1-6 | 485 | 2650 | 47 |
| E1-7 | 480 | 1800 | 30 |
| E1-8 | 490 | 1300 | 35 |
| E1-9 | 490 | 1900 | 33 |
| E1-10 | 495 | 3100 | 30 |
| E1-11 | 60 | 4500 | 35 |
| E1-12 | 485 | 1750 | 37 |
| C1-1 | 550 | 1700 | 20 |
| C1-2 | 550 | 1800 | 25 |
| C1-3 | 650 | 1600 | 21 |
| C1-4 | 630 | 1300 | 19 |
| C1-5 | 550 | 1200 | 9 |
| C1-6 | 550 | 950 | 12 |
| C1-7 | 650 | 1500 | 11 |
| C1-8 | 630 | 2200 | 10 |
| C1-9 | 100 | 2600 | 7 |

A: Embodiments or Comparative Examples

Deposition Target Object S: stainless steel (SUS304)
Deposition Gas Pressure: 0.1–1 Torr

| | |
|---|---|
| | (selected from the range depending on film material, etc.) |
| Steady RF Power: | frequency = 13.56 MHZ |
| | 0.3–1 kW |
| | (selected from the range depending on film material, etc.) |
| Pulse-Modulated RF Power | |
| Basic RF Power: | frequency = 13.56 MHZ |
| | 0.3–1 kW |
| | (selected from the range depending on film material, etc.) |
| pulse-modulation: | frequency = 60 kHz |
| | duty ratio = 50% |
| Steady DC Power: | –1 kV, maximum current value = 20 A |
| Pulse Form DC power | |
| basic DC power: | voltage = –1 kV |
| | maximum current value = 20 A |
| | pulse frequency = 10 kHz, |
| | duty ratio = 50% |

Aluminum trichloride ($AlCl_3$) of the deposition material gas is produced by reaction of hydrochloric acid (HCl) with aluminum (Al) chips.

From the foregoing results, it can be understood that the films obtained by the embodiments 1-1 to 1-12 can have higher film adherence, can be deposited at lower temperatures and can have higher hardness than the film obtained by the comparative examples 1-1 to 1-9.

Description will now be given on other specific embodiments of deposition of carbon films by the method and apparatus of the invention as well as comparative examples not employing the method and apparatus of the invention. All of these embodiments and examples commonly employ the apparatus condition that the electrode 2 has a diameter of 280 mm.

Embodiment 2-1

The apparatus in FIG. 1 was used to form a DLC. film on the object S made of silicon. The DLC. film was formed of an interface layer in contact with the object S and an upper layer. The interface layer was deposited by applying a steady RF power and a DC. power in a superposed manner to the electrode 2 also serving as the object holder. The upper layer was deposited by applying only the steady RF power to the electrode 2.

DEPOSITION CONDITIONS

Deposition Target Object S material: silicon size (diameter): 4 inches
RF Power: frequency: 13.56 MHz, 150 W
Self-Bias Voltage: –80 V
DC. Bias Voltage: –350 V (only for interface layer)
Deposition Material Gas: $CH_4$, 50 sccm
Deposition Pressure: 0.1 Torr
Deposition Temperature: 25° C.
Deposition Time: 5 minutes (interface layer) 55 minutes (upper layer)

Embodiment 2-2

The apparatus in FIG. 5 was used to form a DLC. film on the object S made of silicon. The DLC. film was formed of an interface layer in contact with the object S and an upper layer. The interface layer was deposited by applying a pulse-modulated RF power and a DC. power in a superposed manner to the electrode 2 also serving as the object holder. The upper layer was deposited by applying only the steady RF power to the electrode 2.

DEPOSITION CONDITIONS

Deposition Target Object S material: silicon size (diameter): 4 inches
RF Power
    For Interface Layer: Basic RF power of 13.56 MHz and 150 W was pulse-modulated with modulation frequency of 100 kHz and duty ratio of 50%.
    For Upper Layer: Steady RF power of 13.56 MHz and 150 W.
Self-Bias Voltage: −80 V
DC. Bias Voltage: −350 V (only for interface layer)
Deposition Material Gas: $CH_4$, 50 sccm
Deposition Pressure: 0.1 Torr
Deposition Temperature: 25° C.
Deposition Time: 7.5 minutes (interface layer) 55 minutes (upper layer)

Comparative Example 2-1

Figure 10:
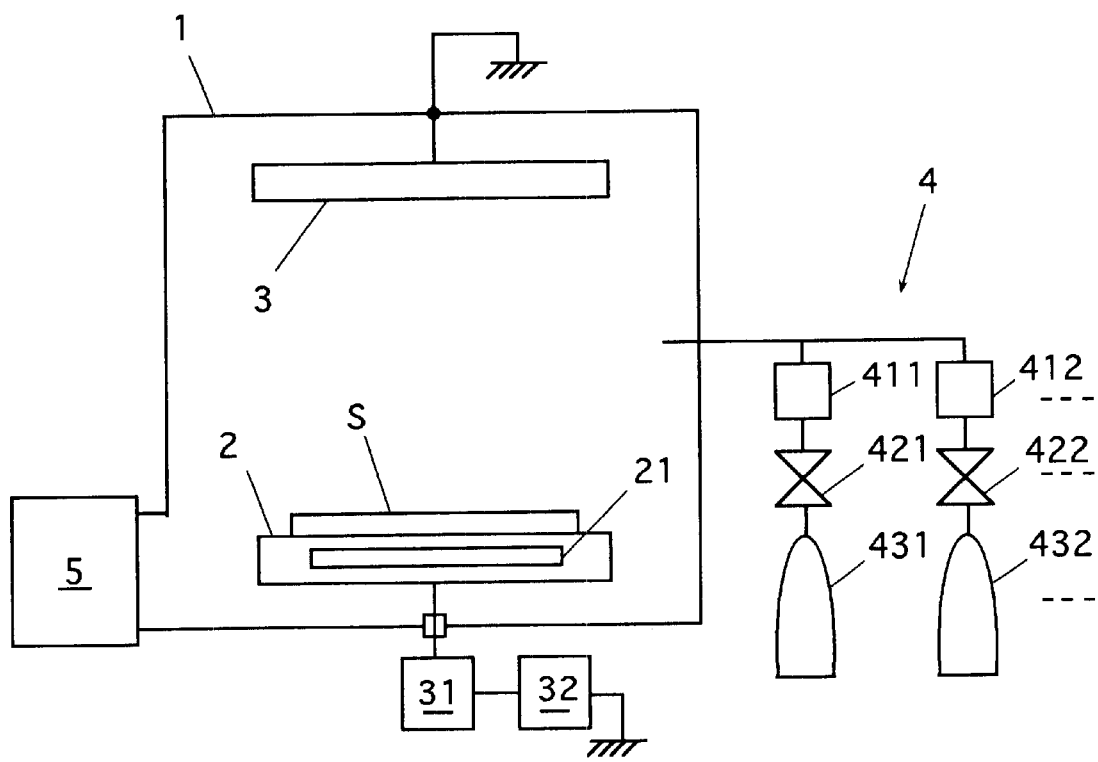
FIG. 10 shows a schematic structure of still another example of a plasma CVD apparatus in the prior art.

The apparatus in FIG. 10 was used to form a DLC. film on the object S made of silicon by applying a steady RF power to the electrode 2. The DLC. film was deposited under the same conditions as those for deposition of the upper layers in the foregoing embodiments 2-1 and 2-2.

DEPOSITION CONDITIONS

Deposition Target Object S material: silicon size (diameter): 4 inches
RF Power: 13.56 MHz, 150 W
Self-Bias Voltage: −80 V
Deposition Material Gas: $CH_4$, 50 sccm
Deposition Pressure: 0.1 Torr
Deposition Temperature: 25° C.
Deposition Time: 60 minutes The film stresses and film adherence strengths of the DLC. films deposited in the embodiments 2-1 and 2-2 as well as the comparative example 2-1 were measured. The results are shown in the following table 3. Deposition rates in these embodiments and example are also shown therein. The film stresses were measured with a laser-type displacement measuring device (manufactured by Flexus Corp., 500), and the adherence strengths of the films were measured with a microscratch device (manufactured by CSEM Corp., Levetester).

TABLE 3

| | Film Stress (dyne/cm$^2$) | Adherence Strength (N) | Deposition Rate (Å/min) |
|---|---|---|---|
| E2-1 | 9.2 × 10$^9$ | 17 | 30; 60° |
| E2-2 | 8.5 × 10$^9$ | 18 | 20; 60° |
| C2-1 | 7.2 × 10$^9$ | 12 | 60 |

*interface layer deposition; upper layer deposition

From the results, it can be found that the DLC. films in the embodiments 2-1 and 2-2 deposited with applying the DC bias voltage to the electrode 2 also serving as the object holder have considerably large film adherence strengths compared with the DLC. film in the comparative example 2-1 not employing the DC. bias.

Embodiment 2-3

The apparatus in FIG. 1 was used, and a DLC. film was formed on the deposition target object S made of a silicone resin which is a thermosetting resin. The DLC. film was formed of an interface layer and an upper layer. The interface layer was deposited by applying a steady RF power and a DC. power in a superposed manner to the electrode 2. The upper layer was deposited by applying only the steady RF power to the electrode 2.

DEPOSITION CONDITIONS

Deposition Target Object S material: silicone resin size: 100 mm×100 mm×5 mm (thickness)
RF Power: 13.56 MHz, 150 W
Self-Bias Voltage: −80 V
DC. Bias Voltage: −350 V (only for interface layer)
Deposition Material Gas: $CH_4$, 50 sccm
Deposition Pressure: 0.1 Torr
Deposition Temperature: 25° C.
Deposition Time: 2 minutes (for interface layer) 16 minutes (for upper layer)

Embodiment 2-4

The apparatus in FIG. 5 was used, and a DLC. film was formed on the deposition target object S made of a silicone resin which is a thermosetting resin. The DLC. film was formed of an interface layer and an upper layer. The interface layer was deposited by applying a pulse-modulated RF power and a DC power in a superposed manner to the electrode 2. The upper layer was deposited by applying only the steady RF power to the electrode 2.

DEPOSITION CONDITIONS

Deposition Target Object S material: silicone resin size: 100 mm×100 mm×5 mm (thickness)
RF Power
    For Interface Layer: Basic RF power of 13.56 MHz and 150 W was pulse-modulated with modulation frequency of 100 kHz and duty ratio of 50%.
    For Upper Layer: Steady RF power of 13.56 MHz and 150 W.
Self-Bias Voltage: −80 V
DC. Bias Voltage: −350 V (only for interface layer)
Deposition Material Gas: $CH_4$, 50 sccm
Deposition Pressure: 0.1 Torr
Deposition Temperature: 25° C.
Deposition Time: 2.5 minutes (interface layer) 16 minutes (upper layer)

Comparative Example 2-2

The apparatus in FIG. 10 was used to form a DLC. film on the deposition target object S made of silicone resin, which is a thermosetting resin, by applying a steady RF power to the electrode 2. The DLC. film was deposited under the same conditions as those for deposition of the upper layers in the foregoing embodiments 2-3 and 2-4.

DEPOSITION CONDITIONS

Deposition Target Object S material: silicone resin
size: 100 mm×100 mm×5 mm (thickness)

RF Power: 13.56 MHz and 150 W

Self-Bias voltage: −80 V

Deposition Material Gas: $CH_4$, 50 sccm

Deposition Pressure: 0.1 Torr

Deposition Temperature: 25° C.

Deposition Time: 17 minutes

The film stresses and film adherence strengths of the DLC. films deposited in the embodiments 2-3 and 2-4 and the comparative example 2-2 were measured. The results are shown in the following table 4. Deposition rates in these embodiments and example are also shown therein. The film stresses were measured with the laser-type displacement measuring device already described, and the adherence strengths of the films were measured with the microscratch device already described.

TABLE 4

|   | Film Stress (dyne/cm$^2$) | Adherence Strength (N) | Deposition Rate (Å/min) |
|---|---|---|---|
| E2-3 | $8.2 \times 10^9$ | 8 | 150; 300° |
| E2-4 | $7.5 \times 10^9$ | 9 | 120; 300° |
| C2-2 | $6.2 \times 10^9$ | 5 | 300 |

*interface layer deposition; upper layer deposition

From the results, it can be found that the DLC. films in the embodiments 2-3 and 2-4 deposited by applying the DC. bias voltage to the electrode 2 also serving as the object holder have considerably large film adherence strengths compared with the DLC. film in the comparative example 2-2 not employing the DC. bias voltage.

Measurement was made to determine friction coefficients of the objects coated with the DLC. films which were obtained by the embodiments 2-3 and 2-4 and the comparative example 2-2 as well as the object S made of the same silicone resin as those of the embodiments and example, which was coated with silicone oil, i.e., lubricant (comparative example X), and more specifically the friction coefficients between these objects with respect to an object made of PTFE (polytetrafluoroethylene) were measured. The friction coefficients were measured in such a manner that the other object made of PTFE having a tip curvature of R18 was laid on the object coated with the DLC. film, and a weight of 10 grams was laid on the other object with an acrylic plate therebetween. The friction coefficients were also measured after repetitively sliding (1000 times and 5000 times) the other object made of PTFE with respect to the same portions of the objects coated with the DLC. films at a speed of 50 mm/minute. The results are shown in the following table 5.

TABLE 5

|   | Friction Coefficient | | |
|---|---|---|---|
|   | Initial | 1000 times | 5000 times |
| E2-3 | 0.56 | 0.56 | 0.58 |
| E2-4 | 0.54 | 0.55 | 0.56 |
| C2-2 | 0.55 | 0.57 | 1.50 (peeling) |
| CX | 0.54 | 2.52 | 4.50 |

The following can be understood from the results. The friction coefficient of the object of the comparative example X coated with lubricant was deteriorated with increase in number of sliding with respect to the other object. Conversely, according to each of the objects coated with the DLC. films in the embodiments 2-3 and 2-4 having the interface layers which were deposited employing the superposed DC. bias voltages, deterioration of the friction coefficients was not found. According to the object coated with the DLC. film in the comparative example 2-2 which did not employ the DC. bias voltage, the film was partially peeled off and the friction coefficient was deteriorated when the sliding occurred 5000 times.

As described above, the DLC. film made of the interface layer and the upper layer was deposited over the object made of thermosetting resin, and the DC. bias voltage was applied when depositing the interface layer. Thereby, the hard DLC film can be deposited with a good adherence on the object made of a resin, i.e., the softer object than the metal object. Therefore, it can be found that the object had a durable lubricity.

Embodiment 2-5

The apparatus in FIG. 1 was used to form a DLC. film on the deposition target object S made of polytetrafluoroethylene (PTFE) which is a thermoplastic resin. The DLC. film was formed of an interface layer in contact with the object S and an upper layer. The interface layer was deposited by applying a steady RF power and a DC power in a superposed manner to the electrode 2. The upper layer was deposited by applying only the steady RF power to the electrode 2.

DEPOSITION CONDITIONS

Deposition Target Object S material: PTFE size: 100 mm×100 mm×5 mm (thickness)
RF Power: 13.56 MHz and 150 W (for interface layer)
Self-Bias Voltage: −80 V
DC. bias Power: −350 V (only for interface layer)
Deposition Material Gas: $CH_4$, 50 sccm
Deposition Pressure: 0.1 Torr
Deposition Temperature: 25° C.
Deposition Time: 2 minutes (interface layer) 24 minutes (upper layer)

Embodiment 2-6

The apparatus in FIG. 5 was used to form a DLC. film on the object S made of PTFE which is a thermoplastic resin. The DLC. film was formed of an interface layer and an upper layer. The interface layer was deposited by applying a pulse-modulated RF power and a DC. power in a superposed manner to the electrode 2. The upper layer was deposited by applying only the steady DC. power to the electrode 2.

DEPOSITION CONDITIONS

Deposition Target Object S material: PTFE size: 100 mm×100 mm×5 mm (thickness)
RF Power
For Interface Layer: Basic RF power of 13.56 MHz and 150 W was pulse-modulated with modulation frequency of 100 kHz and duty ratio of 50%.
For Upper Layer: Steady RF power of 13.56 MHz and 150 W.
Self-Bias voltage: −80 V
DC. Bias Voltage: −350 V (only for interface layer)
Deposition Material Gas: $CH_4$, 50 sccm
Deposition Pressure: 0.1 Torr
Deposition Temperature: 25° C.
Deposition Time: 2.5 minutes (interface layer) 24 minutes (upper layer)

Comparative Example 2-3

The apparatus in FIG. 10 was used to form a DLC. film on the deposition target object S made of PTFE, which is a thermoplastic resin, with a plasma formed from a deposition material gas by applying a steady RF power. The DLC. film was deposited under the same conditions as those for deposition of the upper layers in the foregoing embodiments 2-5 and 2-6.

DEPOSITION CONDITIONS

Deposition Target Object S material: PTFE size: 100mm×100 mm×5 mm (thickness)
RF Power: 13.56 MHz and 150 W
Self-Bias Voltage: ×80 V
Deposition Material Gas: $CH_4$, 50 sccm
Deposition Pressure: 0.1 Torr
Deposition Temperature: 25° C.
Deposition Time: 25 minutes For the DLC. films obtained in the embodiments 2-5 and 2-6 and the comparative example 2-3, the film stresses and film adherence strengths were measured in the same manner as the foregoing. The results are shown in the following table 6. Deposition rates in these embodiments and example are also shown.

TABLE 6

| | Film Stress (dyne/cm$^2$) | Adherence Strength (N) | Deposition Rate (Å/min) |
|---|---|---|---|
| E2-5 | 9.2 × 10$^9$ | 7 | 100: 200° |
| E2-6 | 8.5 × 10$^9$ | 8 | 80; 200° |
| C2-3 | 7.2 × 10$^9$ | 3 | 200 |

*interface layer deposition; upper layer deposition

The following can be understood from the results. The respective DLC. films in the embodiments 2-5 and 2-6 which were deposited with the DC. bias voltage applied to the electrode also serving as the object holder have considerably larger adherence strengths than the DLC. film in the comparative example 2-3 which did not employ the DC. bias voltage.

Then, measurement was performed in the same manner as the above to determine friction coefficients of the DLC-film coated objects obtained in the embodiments 2-5 and 2-6 and the comparative example 2-3 as well as an object S made of PTFE, the same material as the above and was coated with silicone oil, i.e., lubricant (comparative example Y). The results are shown in the following table 7.

TABLE 7

| | Friction Coefficient | | |
|---|---|---|---|
| | Initial | 1000 times | 5000 times |
| E2-5 | 0.56 | 0.56 | 0.58 |
| E2-6 | 0.54 | 0.55 | 0.56 |
| C2-3 | 0.55 | 0.57 | 1.30 (peeling) |
| CY | 0.66 | 1.20 | 2.00 |

The following can be understood from the results. The object of the comparative example Y coated with lubricant exhibited the friction coefficient which was deteriorated with increase in number of sliding with respect to the other object. However, each of the DLC. film coated objects of the embodiments 2-5 and 2-6 of the invention, which were formed with the DC. bias voltage, did not exhibit such deterioration of the friction coefficient. According to the DLC. film coated object of the comparative example 2-3, which did not employ the DC. bias voltage, the film was partially peeled off and the friction coefficient was deteriorated when it slid 5000 times with respect to the other object.

As described above, it can be understood that, similarly to the foregoing case of the object made of the thermosetting resin, the hard DLC. film can be deposited on the object made of a relatively soft resin with a good adherence, and thereby the object can have a durable lubricity.

Embodiment 2-7

In the DLC. film deposition of the embodiment 2-1 using the apparatus shown in FIG. 1, an ammonia ($NH_3$) gas was added to the deposition material gas immediately before completion of the deposition, so that a carbon nitride layer was formed at the surface portion of the film.

DEPOSITION CONDITIONS

Deposition Target Object S material: silicon size (diameter): 4 inches
RF Power: 13.56 MHz, 150 W
Self-Bias Voltage: −80 V
DC. Bias Voltage: −350 V (only for interface layer)
Deposition Material Gas
For DLC. film: $CH_4$, 50 sccm For nitride layer: $CH_4$, 50 sccm $NH_3$, 50 sccm
Deposition Pressure: 0.1 Torr
Deposition Temperature: 25° C.
Deposition Time DLC film: 50 minutes (including 5 minutes for interface layer) Nitride layer: 10 minutes The hardness and film adherence strengths of the DLC film coated objects obtained in the embodiments 2-1 and 2-7 were measured. The results are shown in the following table 8. The film hardness was determined in Vickers hardness, and the film adherence strength was measured in the same manner as the above.

TABLE 8

| | Vickers hardness | Adherence strength (N) |
|---|---|---|
| E2-7 | 1300 | 17 |
| E2-1 | 1100 | 17 |

It can be understood that the DLC. film having the nitride layer at its surface has a higher hardness than the DLC. film not having the nitride layer without deteriorating its film adherence.

Embodiment 2-8

In the process similar to that in the foregoing embodiment 2-5 using the apparatus in FIG. 1, pretreatment was effected on the object S made of PTFE with a sulfur hexafluoride ($SF_6$) gas plasma prior to the deposition. The deposition conditions were the same as those in the embodiment 2-5.

PRETREATMENT CONDITION

Pretreatment Gas: $SF_6$, 50 sccm

RF power: 13.56 MHz, 200 W

Processing Vacuum: 0.1 Torr

Processing Time: 5 minutes

Then, measurement was made to determine the adherence strength of the DLC. film, which was deposited in the embodiment 2-8 affecting the pretreatment with the sulfur pihexafluoride ($SF_6$) gas plasma, to the object S. The results are shown in the following table 9. The table 9 also shows the adherence strength of the DLC. film deposited in the embodiment 2-5 to the object S.

TABLE 9

| | Adherence strength (N) |
|---|---|
| E2-8 | 9 |
| E2-5 | 7 |

From the results, it can be found that the DLC. film in the embodiment 2-8 employing the pretreatment has a larger adherence strength than the DLC. film of the embodiment 2-5

INDUSTRIAL APPLICABILITY

The present invention can be applied, for example, to deposition of films having a high wear resistance on tools and mechanical parts, manufacturing of various kinds of semiconductor devices such as ICs and sensors utilizing semiconductors, manufacturing of various kinds of thin-film devices or the like used in solar cells and liquid crystal displays, and formation of films (e.g., DLC films) having a high wear resistance such as ornaments and diaphragms of loud speakers.

What is claimed is:

1. A plasma CVD method of forming a film on a deposition target object, the method comprising:
   supplying a deposition material gas to a deposition chamber comprising a pair of electrodes, one of which carries a deposition target object, wherein said deposition material gas comprises a gas of a carbon compound or a gas of a carbon compound together with a gas of a kind different from said carbon compound gas other than nitrogen or ammonia gas; forming a plasma from said deposition material gas by applying a radio-frequency (RF) power and a direct current (DC) power, wherein said DC power is applied to said electrode carrying said deposition target object; and depositing a carbon film on said deposition target object, wherein immediately before the completion of said depositing step, either or both a nitrogen gas and an ammonia gas are injected into said deposition chamber, together with said deposition material gas, with the continued application of the power, thereby allowing the formation of a carbon nitride plasma which upon deposition forms a carbon nitride film layer on the surface of the carbon film.

2. The plasma CVD method according to claim 1, wherein said RF power is a modulated RF power.

3. The plasma CVD method according to claim 2, wherein said modulated RF power is produced by affecting a modulation on a basic RF power of a predetermined frequency with a modulation frequency in a range from $1/10^5$ to $1/10$ of said predetermined frequency.

4. The plasma CVD method according to claim 1, wherein said RF power is applied to an electrode different from said electrode carrying said deposition target object.

5. The plasma CVD method according to claim 1, wherein said RF power and said DC. power are applied in a superposed manner to said electrode carrying said deposition target object.

6. The plasma CVD method according to claim 1, wherein said DC. power has a pulse form.

7. The plasma CVD method according to claim 1, wherein said deposition target object is made of an organic material.

8. The plasma CVD method according to claim 1, wherein said deposition target object is made of ceramics.

9. The plasma CVD method according to claim 1, wherein said carbon film is deposited on said deposition target object after said object is exposed to a plasma of at least one kind of gas selected from the group consisting of a fluorine-contained gas, a hydrogen gas and an oxygen gas.

10. A plasma CVD method of forming a film on a deposition target object, the method comprising:
    supplying a deposition material gas to a deposition chamber comprising a pair of electrodes, one of which carries a deposition target object, wherein said deposition material gas comprises a gas of a carbon compound or a gas of a carbon compound together with a gas of a kind different from said carbon compound gas other than nitrogen or ammonia gas;
    forming a plasma from said deposition material gas by applying a radio-frequency (RF) power and a direct current (DC) power, wherein said DC. power is applied to said electrode carrying said deposition target object;
    in a first depositing step, depositing an interface layer of a carbon film on said deposition target object; and
    thereafter, in a second continuous depositing step, depositing an upper layer on said interface layer, wherein immediately before completion of said second depositing step, either or both a nitrogen gas and an ammonia gas are injected into said deposition chamber, together with said deposition material gas, with the continued application of the power, thereby allowing the formation of a carbon nitride plasma which upon deposition forms an upper layer of a carbon nitride film on the surface of the carbon film.

11. The plasma CVD method according to claim 10, wherein said deposition target object is made of an organic material.

12. The plasma CVD method according to claim 10, wherein said deposition target object is made of ceramics.

* * * * *